(12) United States Patent
Enokido et al.

(10) Patent No.: US 6,467,673 B2
(45) Date of Patent: *Oct. 22, 2002

(54) BONDING APPARATUS AND BONDING METHOD

(75) Inventors: Satoshi Enokido, Hachioji; Ryuichi Kyomasu, Kodaira; Shigeru Hayata, Tachikawa; Toshiaki Sasano, Sagamihara, all of (JP)

(73) Assignee: Kabushiki Kaisha Shinkawa, Tokyo (JP)

(*) Notice: Subject to any disclaimer, the term of this patent is extended or adjusted under 35 U.S.C. 154(b) by 96 days.

This patent is subject to a terminal disclaimer.

(21) Appl. No.: 09/750,841

(22) Filed: Dec. 28, 2000

(65) Prior Publication Data

US 2001/0016062 A1 Aug. 23, 2001

(30) Foreign Application Priority Data

Dec. 28, 1999 (JP) .......................................... 11-375077

(51) Int. Cl.⁷ ............................................ H01L 21/607
(52) U.S. Cl. ..................... 228/105; 228/180.5; 228/1.1; 228/9
(58) Field of Search ................................ 228/105, 103, 228/4.5, 9, 10, 11, 1.1, 110.1, 180.5

(56) References Cited

U.S. PATENT DOCUMENTS

| 4,671,446 A | * | 6/1987 | Sherman | 228/105 |
| 5,516,023 A | * | 5/1996 | Kono | 228/105 |
| 5,702,049 A | * | 12/1997 | Biggs et al. | 228/105 |
| 5,803,341 A | * | 9/1998 | Abe | 228/102 |
| 6,337,480 B1 | * | 1/2002 | Andrien et al. | 250/281 |

FOREIGN PATENT DOCUMENTS

JP 2982000 9/1999

* cited by examiner

Primary Examiner—M. Alexandra Elve
Assistant Examiner—Len Tran
(74) Attorney, Agent, or Firm—Koda & Androlia

(57) ABSTRACT

Wire bonding method and apparatus in which axial center of a bonding tool is brought to a reference member, and light-emitting diodes are sequentially lit so that images of the reference member and bonding tool in the X and Y directions are acquired by an offset correction camera. In this way, the amount of deviation between the bonding tool and the reference member is measured. Then, a position detection camera is caused to approach the reference member, and the amount of deviation between the optical axis of the position detection camera and the reference member is measured by the position detection camera. The accurate offset amount are determined on the basis of these measured values and the amounts of movement.

9 Claims, 6 Drawing Sheets

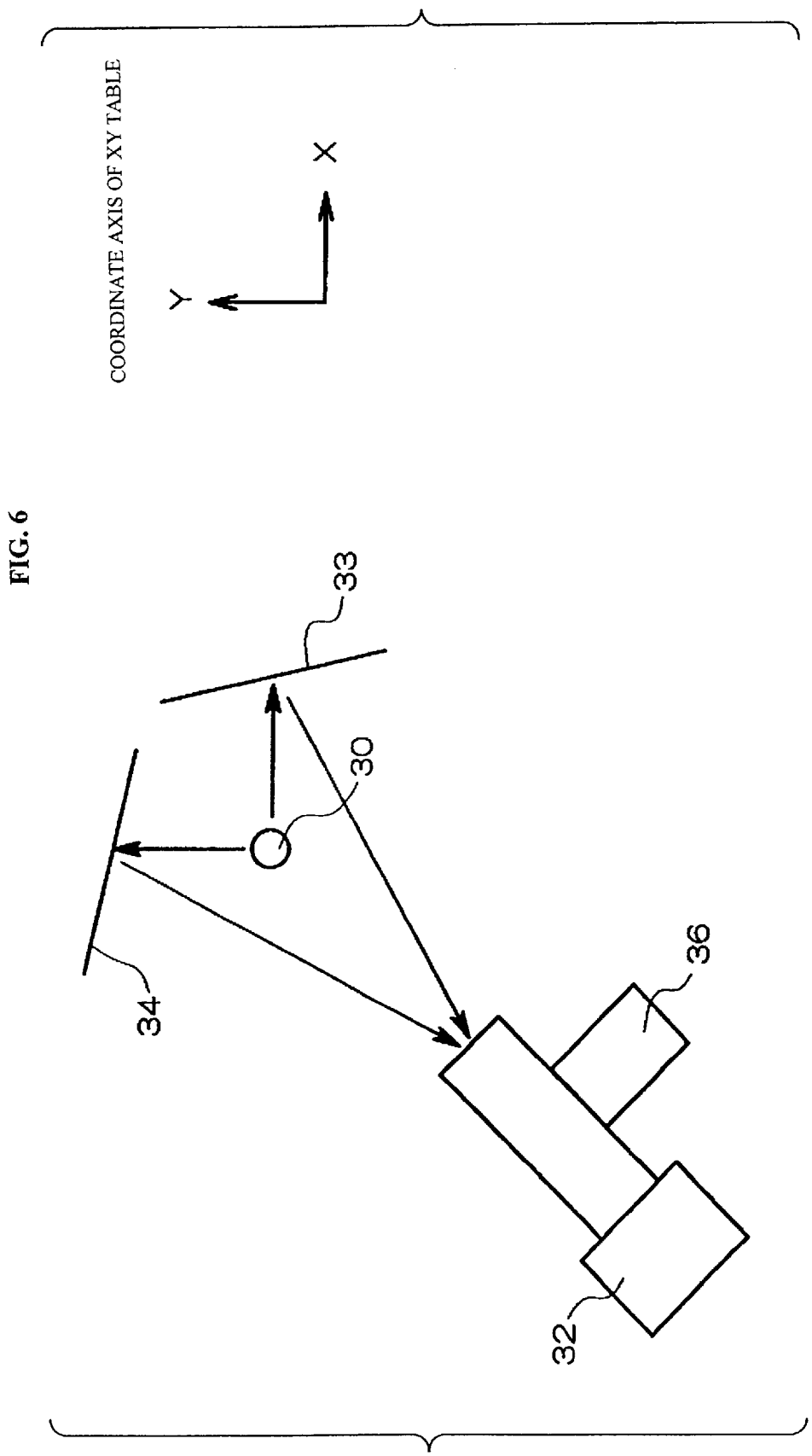

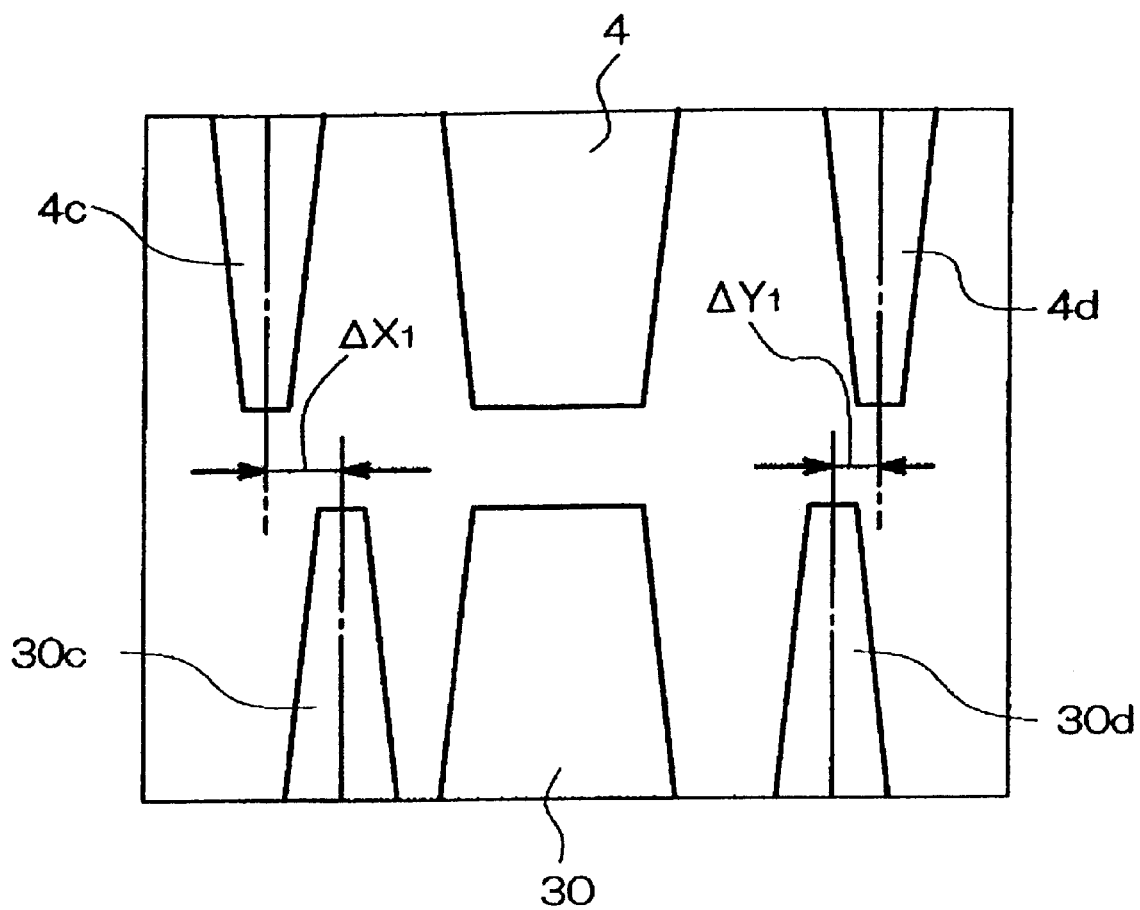

BONDING APPARATUS AND BONDING METHOD

BACKGROUND OF THE INVENTION

1. Field of the Invention

The present invention relates to a bonding apparatus and bonding method, and more specifically relates to an apparatus and method for accurately calculating the amount of offset of two processing members such as a tool and a position detection camera which detects the bonding position, etc.

2. Prior Art

Below, a wire bonding apparatus will be described as one example. A position detection camera which detects the positions of the bonding points on a semiconductor device, and a bonding arm which has a tool that performs bonding attached to one end, are installed on a bounding head which is mounted on an XY table. Furthermore, the position detection camera and bonding arm are attached to the bonding head with the optical axis of the position detection camera and the axial center of the tool shifted by a fixed distance so that the tool and bonding arm will not interfere with the visual field of the position detection camera when position detection camera detects the position of a bonding point. Generally, the distance between the optical axis of the position detection camera and the axial center of the tool is referred to as the "offset" of these two components.

The position detection camera determines a reference point that is used in order to ascertain the position to which the tool is moved. Accordingly, it is extremely important to ascertain the distance by which the position detection camera is offset from the tool. However, since the actual offset amount varies from instant to instant as a result of thermal expansion of the camera holder and bonding arm caused by radiant heat from the high-temperature bonding stage, it is necessary to calibrate the amount of offset when bonding operations are initiated and at an appropriate timing during the bonding operations.

For this purpose, in the bonding method and apparatus proposed in Japanese Patent No. 2982000 owned by the applicant of the present application, a reference member is disposed in a specified position, a position detection camera is moved to a point above the reference part of this reference member, and the positional relationship between this reference part and the optical axis of the position detection camera is measured; furthermore, the tool is moved to a point above the reference part in accordance with an amount of offset that is stored beforehand in memory, and the positional relationship between the reference part and the tool is measured by an offset correction camera; then, the accurate amount of offset is determined by correcting the above-described amount of offset that is stored beforehand in memory. In this structure, the amount of offset between the position detection camera and the tool can be determined with good precision by way of the use of the reference member.

A substantially cylindrical projection is used as one example of the reference member in this structure, and the reference member and tool are measured from the side by the offset correction camera in a state in which both of these parts are caused to face each other. However, since the discrepancy between the reference member and the tool also has a component in the Y direction as well as the X direction, it is necessary to use two offset correction cameras that measure X-direction and Y-direction images in order to use such a projection-form reference member. As a result, a large installation space is required, which leads to an increase in the size of the apparatus.

SUMMARY OF THE INVENTION

The present invention is to solve the problems.

The object of the present invention is to provide an apparatus and method which requires no offset correction cameras even in a case where a projection-form reference member is used.

The above object is accomplished by a first unique structure for a bonding apparatus that comprises:

a reference member disposed in a specified position in the bonding apparatus;

a single image detection member which detects the reference member;

optical members which conduct images to the image detection member, the images being of a processing member that processes an object of processing and of the reference member and being acquired from a plurality of different directions; and an operational processing unit which calculates positional coordinates of the processing member and the reference member based upon images of the processing member and the reference member which are acquired from the plurality of different directions and are picked up by the image detection member.

In the above, the optical members which conduct images of the processing member and reference member that are acquired from a plurality of different directions to the image detection member. As a result, it is not necessary to use two image detection members even in a case where a projection-form reference member is used. In the following description in this specification, the term "processing member" includes detection members such as cameras, etc. in addition to working heads that perform physical working processes on semiconductor devices.

The above object is further accomplished by a second unique structure of the present invention for a bonding apparatus wherein a first processing member and a second processing member are installed so as to be offset from each other, and the bonding apparatus comprises:

a reference member disposed in a specified position;

a single, image detection member used for offset correction, the image detection member detecting the reference member;

optical members which conduct images of the first or second processing member, or both, and of the reference member to the image detection member used for offset correction; the images being acquired from a plurality of different directions; and an operational control device which determines accurate amount of offset based upon:

(a) a measured value obtained by measuring a positional relationship between one of the processing members and the reference member, the processing members being the first and second processing members and in a first attitude in which the first or second processing member is caused to approach the reference member;

(b) a measured value obtained by way of measuring images of another of the processing members and of the reference member with the image detection member used for offset correction, the processing members being the first and second processing members and in a second attitude in which another of the processing members is caused to approach the reference member, and the images being acquired from a plurality of different directions and conducted to the image detection member used for offset correction by the optical members; and (c) amounts of movement of the first and second processing members between the first attitude and the second attitude.

In the above second structure of the present invention, the operational control device determines the accurate amount of offset on the basis of (a) a measured value obtained by measuring the positional relationship between one of the processing members, i.e., the first or second processing member and the reference member, in a first attitude in which the first or second processing member is caused to approach the reference member, (b) a measured value obtained by using the image detection member used for offset correction to measure images of the other of the processing members, i.e., the first or second processing member, and the reference member in a second attitude, in which the other of the processing members, i.e., the first or second processing member, is caused to approach the reference member, and these images being acquired from a plurality of different directions which are conducted to the image detection member used for offset correction by the optical members, and (c) the amounts of movement of the first and second processing members between the first attitude and the second attitude. Thus, since images of the first or second processing member and the reference member that are acquired from a plurality of different directions are conducted by the optical members to the image detection member used for offset correction, the use of two image detection members can be avoided.

The above object is further accomplished by a third unique structure of the present invention for a bonding apparatus that comprises:

an image detection member used for position detection which detects a position of a bonding object;

a bonding tool installed so as to be offset with respect to the image detection member used for position detection;

a reference member disposed in a specified position;

a single, image detection member used for offset correction, the image detection member detecting the reference member;

optical members which conduct images of the bonding tool and of the reference member to the image detection member used for offset correction, the images being acquired from a plurality of different directions; and an operational control device which determines accurate amount of offset based upon:

(a) a measured value obtained by measuring a positional relationship between the image detection member used for position detection and the reference member, the image detection member used for position detection is in a first attitude in which the image detection member used for position detection is caused to approach the reference member;

(b) a measured value obtained by way of measuring images of the bonding tool and of the reference member with the image detection member used for offset correction, the bonding tool being in a second attitude in which the bonding tool is caused to approach the reference member, and the images being acquired from a plurality of different directions and conducted to the image detection member used for offset correction by the optical members; and (c) amounts of movement of the image detection member used for position detection and of the bonding tool between the first attitude and the second attitude.

In this third unique structure of the present invention, one processing member is an image detection member used for position detection, while the other processing member is a tool, and the accurate amount of offset between the image detection member used for position detection and the reference member is determined by the same procedure as in the previous structure of the present application. The third unique structure has the same advantages as those of the previously described first and second unique structures. In addition, since the positional relationship between the image detection member used for position detection and the reference member is measured by means of the image detection member used for position detection, the image detection member used for position detection, which is used in order to detect the positions of bonding points on the semiconductor device, can be utilized to calculate the amount of offset.

The above object is further accomplished by still a fourth unique structure of the present invention for a bonding apparatus that comprises:

a reference member disposed in a specified position;

a single, image detection member used for offset correction, this image detection member detecting the reference member;

optical members which conduct images of a bonding tool and of the reference member to the image detection member used for offset correction, the images being acquired from a plurality of different directions; and the optical members comprising a first reflective body which reflects images of the tool and the reference member and conducts the images to the image detection member used for offset correction, and a second reflective body which is installed in a different position than the first reflective body and reflects images of the tool and the reference member and conducts the images to the image detection member used for offset correction.

In the above, images of the tool and reference member are reflected by a first reflective body and conducted to the image detection member used for offset correction, and are also conducted to the image detection member used for offset correction by being reflected by a second reflective body which is installed in a different position from the first reflective body. As a result, images from a plurality of different directions can be conducted to the image detection member used for offset correction.

In the above fourth structure of the present invention, the optical members can be comprise of: a first reflective body which reflects images of the tool and the reference member and conducts the images to the image detection member used for offset correction; a half-mirror which is installed in a light path between the first reflective body and the image detection member used for offset correction; and a second reflective body which reflects images of the tool and the reference member and conducts the images to the half-mirror; so that the images from the second reflective body are reflected by the half-mirror and conducted to the image detection member used for offset correction.

In the above structure, images of the tool and reference member are conducted to the image detection member used for offset correction by being reflected by the first reflective body and transmitted through the half-mirror, and are also conducted to the image detection member used for offset correction by being reflected by the second reflective body and reflected by the half-mirror. Accordingly, images from a plurality of different directions can be conducted to the image detection member used for offset correction. Furthermore, the optical members can be designed so that the angles of incidence of the images from the respective reflective bodies on the image detection member used for offset correction are equal to each other, thus facilitating image processing.

In the above structure, an image switching means can be further provided that selectively conducts the images from the first reflective body or the images from the second reflective body to the image detection member used for offset correction.

In the above structure, the images from the respective reflective bodies can easily be discriminated by selectively conducting images from the first reflective body or images from the second reflective body to the image detection member used for offset correction by means of the image switching means. As a result, image processing can be further facilitated.

Furthermore, in the above structure, the image switching means can be comprised of:

a first light source which supplies images of the tool and the reference member to the first reflective body;

a second light source which supplies images of the tool and the reference member to the second reflective body; and a brightness ratio altering means which alters brightness ratio of the first or second light source.

With the above structure, the brightness ratio of the first or second light source can be altered by the brightness ratio altering means, so that the switching of images from the respective reflective bodies can easily be accomplished.

Furthermore, in the above structure, the image switching means can be comprised of a screening ratio altering means that alters: a screening ratio of a first light path which extends, via the first reflective body, from the tool and the reference member to the half-mirror; and a second light path which extends, via the second reflective body, from the tool and the reference member to the half-mirror.

With the above structure, the screening ratio of the first or second light path can be altered by the screening ratio altering means, so that the switching of images from the respective reflective bodies can easily be accomplished.

Furthermore, the above-described object is accomplished by a unique steps of the present invention for a wire bonding method which uses: an image detection member used for position detection which detects a position of a bonding object; a bonding tool installed so as to be offset with respect to the image detection member used for position detection; and a reference member disposed in a specified position; and the unique steps of the present invention are:

a positional relationship between the image detection member used for position detection and the reference member with the image detection member used for position detection is measure, the image detection member used for position detection being in a first attitude in which the image detection member used for position detection is caused to approach the reference member;

a positional relationship between the tool and the reference member with the image detection member used for offset correction by way of conducting images of the tool and the reference member is measured, the bonding tool being in a second attitude in which the bonding tool is caused to approach the reference member, and images being acquired from a plurality of different directions; and an accurate amount of offset is determined based upon the measuring results and amounts of movement of the image detection member used for position detection and the tool between the first attitude and second attitude.

With the above-described method, the same effect as that of the third structure of the present invention described above can be obtained.

BRIEF DESCRIPTION OF THE DRAWINGS

FIG. 6 is a plan view of a structural modification of the present invention; and FIG. 7 is an explanatory diagram which shows the images obtained in an attitude in which the tool is caused to approach the reference member in offset correction.

DETAILED DESCRIPTION OF THE INVENTION

Figure 1:
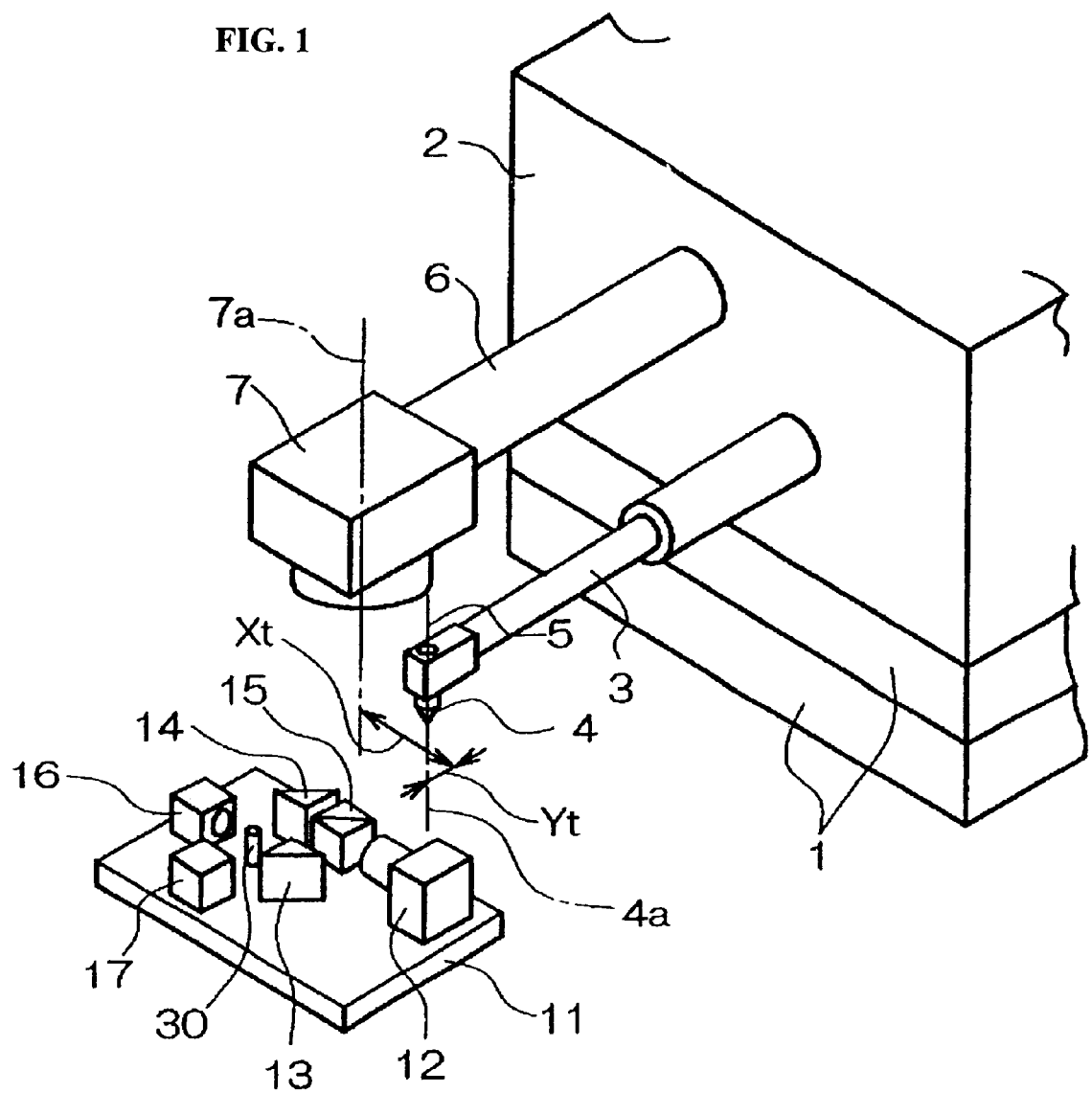
FIG. 1 is a perspective view of the essential elements of a bonding apparatus according to one embodiment of the present invention.

Embodiments of the present invention will be described below with reference to the accompanying drawings. FIG. 1 illustrates a first embodiment of the present invention.

As shown in FIG. 1, a bonding arm 3 is installed so that it can move upward and downward on a bonding head 2 which is mounted on an XY table 1. The bonding arm 3 is driven in the vertical direction by a vertical driving means (not shown). A tool 4 is attached to the tip end part of the bonding arm 3, and a wire 5 is passed through this tool 4. Furthermore, a camera holder 6 is fastened to the bonding head 2, and a position detection camera 7 which is a photo-electric transducer type image detection member equipped with a charge-coupled device (CCD) is fastened to the tip end part of the camera holder 6. The optical axis 7a of the position detection camera 7 and the axial center 4a of the tool 4 are both oriented vertically downward. The optical axis 7a and axial center 4a are offset by offset amounts Xt and Yt in the X and Y directions. The XY table 1 is constructed so that it can be accurately moved in the X direction and Y direction by two pulse motors (not shown) that are installed in the vicinity of the XY table 1. The above structure is a universally known structure.

A reference part supporting stand 11 on which a reference member 30 and offset correction camera 12, etc., are carried is installed in the vicinity of a bonding stage (not shown) on which a semiconductor device is positioned and carried. Prisms 13 and 14, a half-mirror 15, and light-emitting diodes 16 and 17 used as illumination light sources, are disposed on the reference part supporting stand 11.

Figure 2:
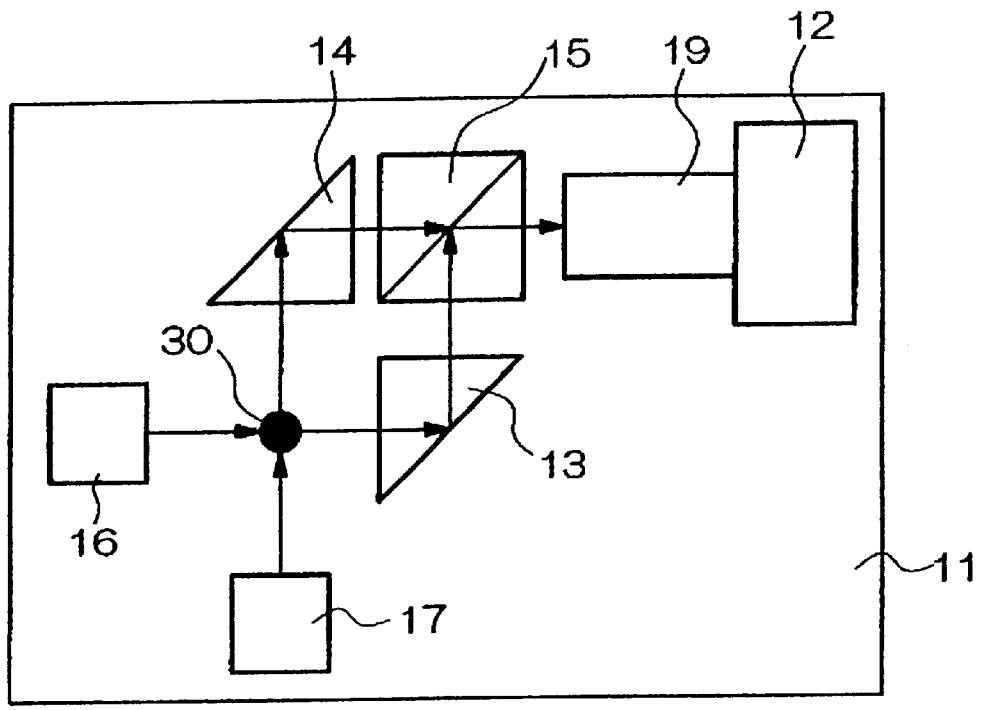
FIG. 2 is a plan view showing the reference member, offset correction camera and related optical system.

As shown in FIG. 2, the prism 13 is installed on the right side of FIG. 2 with respect to the reference member 30, and the prism 14 is installed on the upper side of FIG. 2 with respect to the reference member 30. The light-emitting diode 16 is installed on the opposite side of the reference member 30 from the prism 13, and the light-emitting diode 17 is installed on the opposite side of the reference member 30 from the prism 14. The half-mirror 15 is installed in the light path between the prism 14 and the offset correction camera 12.

The reflective surfaces of the prisms 13 and 14 and the reflective surface of the half-mirror 15 are set parallel to each other, and all of these surfaces are set at an angle of intersection of 45° with respect to the X direction (i.e., the direction formed by the light-emitting diode 16 and prism 13). Accordingly, the light from the light-emitting diode 17 is reflected by the prism 14 and passes through the half-mirror 15 so that this light is conducted to the offset correction camera 12, and the light emitted from the light-emitting diode 16 is reflected by the prism 13 and reflected by the reflective surface of the half-mirror 15 so that this light is conducted to the offset correction camera 12. The offset correction camera 12 is a photo-electric transducer type image detection member equipped with a charge-coupled device (CCD); this camera 12 has a lens 19. Furthermore, it is also possible to use mirror-surface bodies such as mirrors, etc., instead of the prisms 13 and 14.

Figure 3:
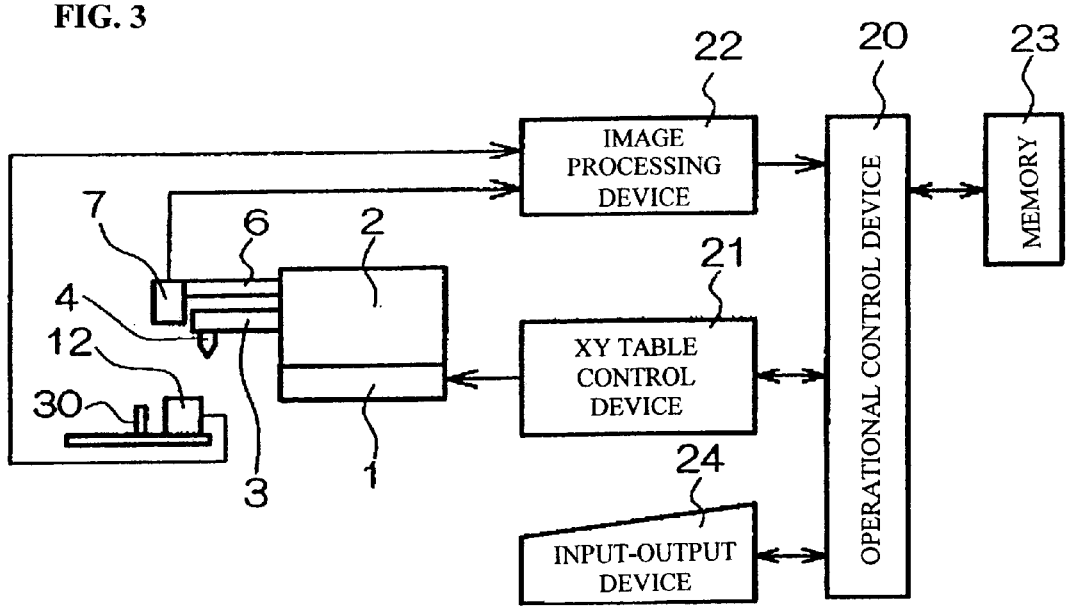
FIG. 3 is a block diagram of the structure of the control system.

As shown in FIG. 3, the XY table 1 is driven by commands from an operational control device 20 via an XY table control device 21. The images acquired by the position detection camera 7 and offset correction camera 12 are converted into electrical signals and processed by an image processing device 22, and the accurate offset amounts Xt and Yt are calculated by the operational control device (which consists of a computer) using a method that will be described later. Offset amounts Xw and Yw are stored beforehand in a memory 23. If the differences between the accurate offset amounts Xt and Yt and the offset amounts Xw and Yw stored beforehand in the memory 23, i.e., the offset correction amounts, are designated as $\Delta X$ and $\Delta Y$, then these accurate offset amounts Xt and Yt, offset amounts Xw and Yw stored beforehand and offset correction amounts $\Delta X$ and $\Delta Y$ are related as shown in Equation 1. Furthermore, in FIG. 3, the reference numeral 24 indicates an input-out device.

$Xt = Xw + \Delta X$ $Yt = Yw + \Delta Y$ Equation 1

Next, the method used to calculate the offset amounts Xt and Yt will be described. First, as indicated by the solid lines in FIG. 4, the XY table 1 is driven (see FIG. 3) by a command from the operational processing device 20 via the XY table control device 21 so that the axial center 4a of the tool 4 is positioned in the vicinity of the reference member 30, and the tool 4 is lowered to a height where it almost touches the reference member 30. Here, it is sufficient if the tool 4 is positioned so that the offset correction camera 12 can image the tool 4 and reference member 30; it is not necessary to align axial center 4a of the tool 4 with the axial center 30a of the reference member 30.

Then, both the tool 4 and the reference member 30 are imaged by the offset correction camera 12, and the positional relationship of the two parts, i.e., the values $\Delta X_1$ and $\Delta Y_1$, are measured.

Figure 5B:
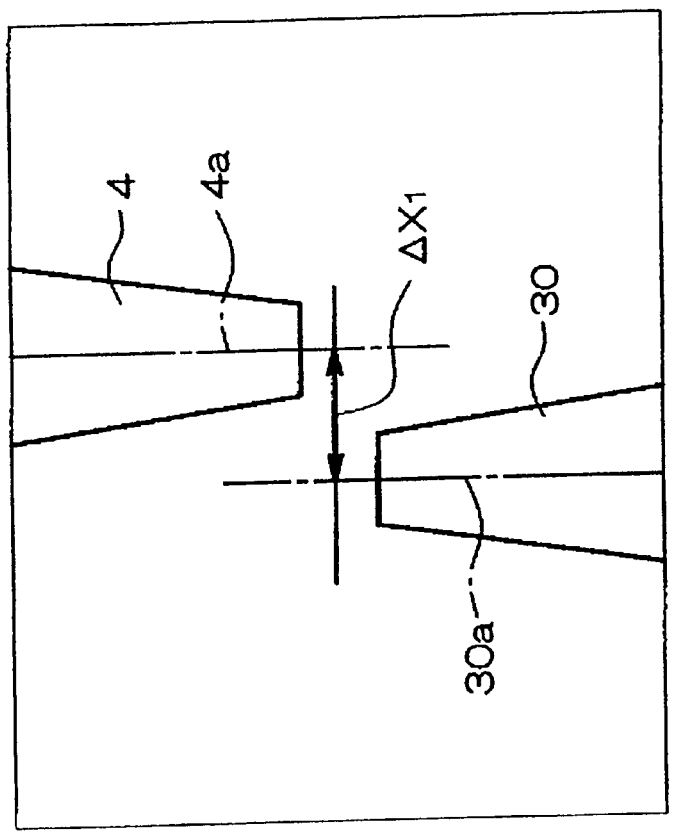
FIGS. 5A and 5B are explanatory diagrams which show the images obtained in an attitude in which the tool is caused to approach the reference member.
Figure 5A:
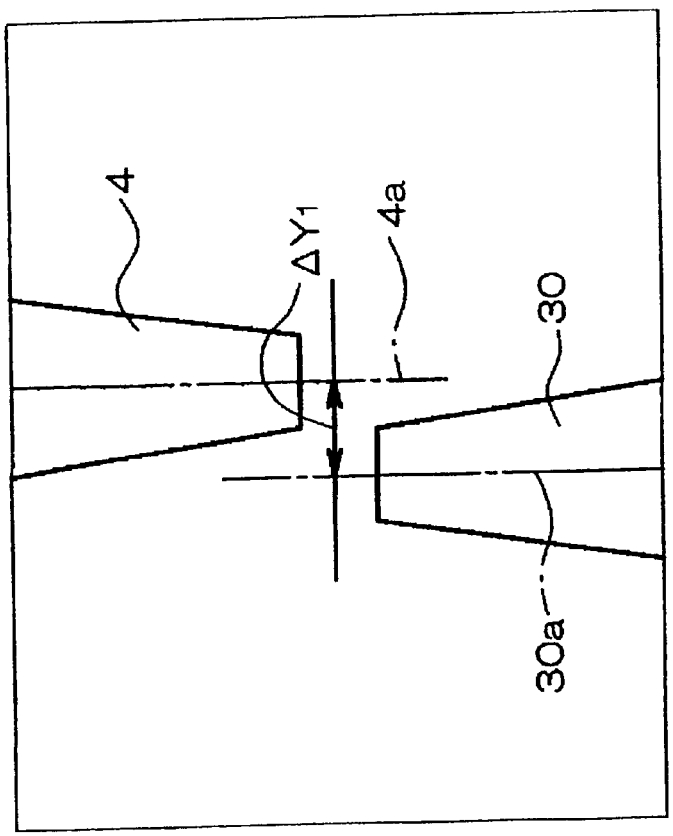

First, if a state is established in which the light-emitting diode 16 is lit and the light-emitting diode 17 is extinguished, images of the tool 4 and reference member 30 are reflected by the reflective surfaces of the prism 13 and half-mirror 15 and conducted to the offset correction camera 12 as shadows with respect to the light from the light-emitting diode 16. As a result, images such as those shown in FIG. 5A are picked up by the offset correction camera 12. These images are subjected to appropriate image processing so that the amount of deviation $\Delta Y_1$ between the axial center 4a of the tool 4 and the axial center 30a of the reference member 30 in the Y direction is calculated.

Next, if a state is established in which the light-emitting diode 16 is extinguished and the light-emitting diode 17 is lit, images of the tool 4 and reference member 30 are reflected by the prism 14 and transmitted through the half-mirror 15 so that these images are conducted to the offset correction camera 12 as shadows with respect to the light from the light-emitting diode 17. As a result, images such as those shown in FIG. 5B are picked up by the offset correction camera 12. These images are subjected to appropriate image processing so that the amount of deviation $\Delta X_1$ between the axial center 4a of the tool 4 and the axial center 30a of the reference member 30 in the X direction is calculated.

Figure 4:
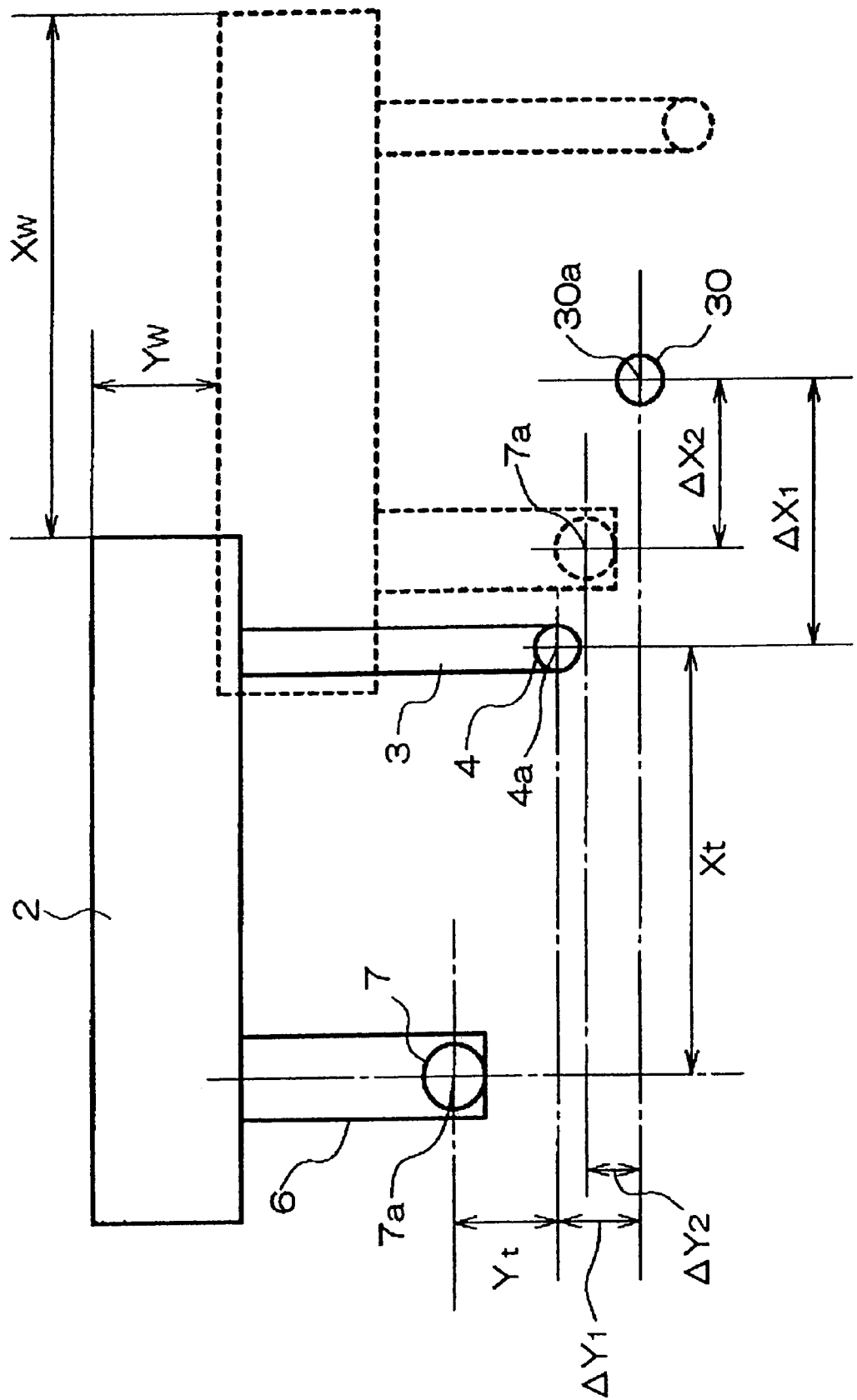
FIG. 4 is a plan view of the layout of the tool, position detection camera and reference member in offset correction.

When $\Delta X_1$ and $\Delta Y_1$ expressing the positional relationship between the tool 4 and the reference member 30 are thus measured, the operational control device 20 then drives the XY table 1 via the XY table control device 21 in accordance with the offset amounts Xw and Yw stored beforehand in the memory 23, so that the position detection camera 7 is moved to the vicinity of the reference member 30 as indicated by the dotted line in FIG. 4. Here, it is sufficient if the position detection camera 7 is a position that allows imaging of the reference member 30; it is not necessary to align the optical axis 7a of the position detection camera 7 with the center of the reference member 30. Then, in this state, the reference member 30 is imaged by the position detection camera 7, and the amounts of deviation $\Delta X_2$ and $\Delta Y_2$ between the axial center 30a of the reference member 30 and the optical axis 7a of the position detection camera 7 is calculated by subjecting this image to appropriate image processing.

If the offset amounts Xw and Yw stored beforehand in memory are the accurate offset amounts Xt and Yt, then the offset correction amounts $\Delta X$ and $\Delta Y$ are zero; accordingly, $\Delta X_1$ and $\Delta Y_1$ should coincide with $\Delta X_2$ and $\Delta Y_2$. However, in cases where the offset amounts Xw and Yw stored in memory beforehand are approximate values, or in cases where the camera holder 6 or bonding arm 3 undergoes thermal expansion due to thermal effects so that the offset amounts Xt and Yt vary, $\Delta X_1$ and $\Delta Y_1$ do not coincide with $\Delta X_2$ and $\Delta Y_2$, and errors (offset correction amounts) $\Delta X$ and $\Delta Y$ are therefore generated. Accordingly, the offset correction amounts $\Delta X$ and $\Delta Y$ are calculated from the measured values $\Delta X_1$ and $\Delta Y_1$ and the measured values $\Delta X_2$ and $\Delta Y_2$ using Equation 2.

$\Delta X = \Delta X_1 - \Delta X_2$ $\Delta Y = \Delta Y_1 - \Delta Y_2$ Equation 2

Accordingly, the operational control device 20 calculates the offset correction amounts $\Delta X$ and $\Delta Y$ according to Equation 2, and then calculates the accurate offset amounts Xt and Yt according to Equation 1 by adding the offset correction amounts $\Delta X$ and $\Delta Y$ to the offset amounts Xw and Yw stored in memory beforehand. The operational control device 20 then corrects (updates) the offset amounts Xw and Yw stored in the memory 23 to the accurate offset amounts Xt and Yt. The offset amounts Xt and Yt thus determined are used as the offset amounts of the position detection camera 7 and tool 4 in subsequent bonding operations.

Thus, in the present embodiment, prisms 13 and 14 and a half-mirror 15 that conduct images of the tool 4 and reference member 30 acquired from a plurality of different directions to the camera are installed; as a result, a single offset correction camera 12 is sufficient even in cases where a projection-form reference member 30 is used, so that it is not necessary to use two cameras.

Furthermore, in the present embodiment, since the positional relationship between the position detection camera 7 and the reference member 30 is measured by the position detection camera 7, the present embodiment is advantageous in that the position detection camera 7 that is used to detect the position of the bonding points of the semiconductor device can be utilized to calculate the offset amounts.

Furthermore, in the present embodiment, since images of the tool 4 and reference member 30 are conducted to the offset correction camera 12 by being reflected by the prism 14 and transmitted through the half-mirror 15 on the one hand, and are likewise conducted to the offset correction camera by being reflected by the prism 13 and reflected by the reflective surface of the half-mirror 15 on the other hand, images from a plurality of different directions can thus be conducted to the offset correction camera 12. Furthermore, since the reflective surfaces of the prisms 13 and 14 and the reflective surface of the half-mirror 15 are disposed as described above, the angles of incidence of the images from the prisms 13 and 14 on the offset correction camera 12 are equal to each other, so that image processing can be simplified.

Furthermore, in the present embodiment, the images from the prism 14 (used to detect the amount of deviation in the X direction) and the images from the prism 13 (used to detect the amount of deviation in the Y direction) can be selectively conducted to the offset correction camera 12 by selectively lighting the light-emitting diodes 16 and 17, so that the images from the respective prisms 13 and 14 can easily be discriminated, thus further simplifying the image processing. Furthermore, in the above embodiment, the light-emitting diodes 16 and 17 are used as illumination light sources, and the reference member 30 is illuminated from the side of the back surface. However, instead of this structure, a light source can be contained in the offset correction camera 12, and the reference member 30 is illuminated from the side of the front surface.

Furthermore, in the above embodiment, the light-emitting diodes 16 and 17 are selectively lit, i.e., in which one light-emitting diode is lit while the other light-emitting diode is extinguished. Instead, the brightness ratio of the two light-emitting diodes can be altered by raising the brightness of one of the light-emitting diodes 16 or 17 and lowering the brightness of the other light-emitting diode 16 or 17. Furthermore, it is also possible to use a structure in which the wavelengths of the light of the light-emitting diodes 16 and 17 are set at different wavelengths, and the images acquired by the offset correction camera 12 are separated according to wavelength, after which $\Delta X_1$ and $\Delta Y_1$ are calculated by performing image processing on the separated images of respective wavelengths. In such a case, the light-emitting diodes 16 and 17 can be simultaneously lit.

Furthermore, the same effect can also be obtained with a structure in which respective mechanical type shutters or liquid crystal shutters, etc., are installed in the light path extending from the reference member 30 to the half-mirror 15 via the prism 14 and the light path extending from the reference member 30 to the half-mirror 15 via the prism 13, and the images from the prisms 13 and 14 are conducted to the offset correction camera 12 either selectively or with a different degree of screening (or transmissivity) by means of these shutters. In such a case, furthermore, the images from the prisms 13 and 14 can be separated from each other by dividing the images picked up by the offset correction camera 12 through the synchronization of these images with the alteration of the degree of screening by means of the mechanical type shutters or liquid crystal shutters.

Furthermore, in the above, the deviation of the tool 4 and reference member 30 is measured using images acquired with both parts set at an angular difference of 90°; however, the relative angle of the two parts need not be 90°. Furthermore, two types of images acquired at different angles are conducted to the offset correction camera 12 via a half-mirror 15. However, these images can be conducted to the offset correction camera 12 without passing through a half-mirror.

More specifically, the mirrors 33 and 34 are installed in orientations that are not perpendicular to each other, and a projected image from the reference member 30 in the X direction in terms of the coordinate axes of the XY table is conducted to an offset correction camera 32 via the mirror 33, while a projected image from the reference member 30 in the Y direction in terms of the coordinate axes of the XY table is conducted to this offset correction camera 32 via the mirror 34. A light-emitting diode 36 which illuminates the reference member 30 is installed in the vicinity of the offset correction camera 32.

In this case, the images picked up by the offset correction camera 32 are as shown in FIG. 7. A reflected image 4c of the tool 4 and a reflected image 30c of the reference member 30 are acquired on the left side of FIG. 7, while a reflected image 4d of the tool 4 and a reflected image 30d of the reference member 30 are acquired on the right side of FIG. 7. The deviations $\Delta X_1$ and $\Delta Y_1$ of the tool 4 and reference member 30 are determined by subjecting these images to appropriate image processing. In these images, furthermore, sin non-orthogonal coordinate systems are formed in accordance with the angle formed by the mirrors 33 and 34, the measured values are processed using triangular functions in accordance with this angle.

Furthermore, in the above-described embodiment, the positional relationship of the position detection camera 7 and reference member 30 is measured by moving the tool after the positional relationship of the tool 4 and the reference member 30 is measured. However, the two measurements may also be performed in the reverse order. Furthermore, the processing members in the present invention are a position detection camera 7 and a tool 4. However, the processing members of the present invention are not limited to such a combination; the present invention can also be used to measure the amount of offset between two cameras or between two working heads.

Furthermore, in the above embodiment, the prisms 13 and 14 and a half-mirror 15, or mirrors 33 and 34, are employed as optical members. However, the optical members in the present invention may have any structure that is capable of conducting images acquired from a plurality of different directions to an image detection member; for example, optical fibers installed facing the reference member 30 at different angles may also be used. Furthermore, a camera is used as the image detection member in the above-described embodiment. However, the image detection member used in the present invention may have any structure that is capable of detecting images. For example, a line sensor may also be used.

Moreover, in the above, the present invention is described with reference to a wire bonding apparatus. However, it goes without saying that the present invention can be applied to various other types of bonding apparatuses such as die bonding apparatuses, tape bonding apparatuses or flip-chip bonding apparatuses, etc.

What is claimed is:

1. A bonding apparatus comprising:
   a reference member disposed in a specified position in said bonding apparatus,
   a single image detection member which detects said reference member,
   optical members which conduct images to said image detection member, said images being of a processing member that processes an object of processing and of said reference member and being acquired from a plurality of different directions, and
   an operational processing unit which calculates positional coordinates of said processing member and said reference member based upon images of said processing member and said reference member which are acquired from said plurality of different directions and are picked up by said image detection member.

2. A bonding apparatus wherein a first processing member and a second processing member are installed so as to be offset from each other, said bonding apparatus comprising:
   a reference member disposed in a specified position,
   a single, image detection member used for offset correction, said image detection member detecting said reference member,
   optical members which conduct images of said first or second processing member, or both, and of said reference member to said image detection member used for offset correction, said images being acquired from a plurality of different directions, and
   an operational control device which determines accurate amount of offset based upon:
   (a) a measured value obtained by measuring a positional relationship between one of said processing members and said reference member, said processing members being said first and second processing members and in a first attitude in which said first or second processing member is caused to approach said reference member,
   (b) a measured value obtained by way of measuring images of another of said processing members and of said reference member with said image detection member used for offset correction, said processing members being said first and second processing members and in a second attitude in which another of said processing members is caused to approach said reference member, and said images being acquired from a plurality of different directions and conducted to said image detection member used for offset correction by said optical members, and
   (c) amounts of movement of said first and second processing members between said first attitude and said second attitude.

3. A bonding apparatus comprising:
   an image detection member used for position detection which detects a position of a bonding object,
   a bonding tool installed so as to be offset with respect to said image detection member used for position detection,
   a reference member disposed in a specified position,
   a single, image detection member used for offset correction, said image detection member detecting said reference member,
   optical members which conduct images of said bonding tool and of said reference member to said image detection member used for offset correction, said images being acquired from a plurality of different directions, and
   an operational control device which determines accurate amount of offset based upon:
   (a) a measured value obtained by measuring a positional relationship between said image detection member used for position detection and said reference member, said image detection member used for position detection is in a first attitude in which said image detection member used for position detection is caused to approach said reference member,
   (b) a measured value obtained by way of measuring images of said bonding tool and of said reference member with said image detection member used for offset correction, said bonding tool being in a second attitude in which said bonding tool is caused to approach said reference member, and said images being acquired from a plurality of different directions and conducted to said image detection member used for offset correction by said optical members, and
   (c) amounts of movement of said image detection member used for position detection and of said bonding tool between said first attitude and said second attitude.

4. A bonding apparatus comprising:
   a reference member disposed in a specified position,
   a single, image detection member used for offset correction, said image detection member detecting said reference member,
   optical members which conduct images of a bonding tool and of said reference member to said image detection member used for offset correction, said images being acquired from a plurality of different directions, and
   said optical members comprising
   a first reflective body which reflects images of said tool and said reference member and conducts said images to said image detection member used for offset correction, and
   a second reflective body which is installed in a different position than said first reflective body and reflects images of said tool and said reference member and conducts said images to said image detection member used for offset correction.

5. A bonding apparatus comprising:
   a reference member disposed in a specified position,
   a single, image detection member used for offset correction, said image detection member detecting said reference member,
   optical members which conduct images of a bonding tool and of said reference member to said image detection member used for offset correction, said images being acquired from a plurality of different directions, and
   said optical members comprising
   a first reflective body which reflects images of said tool and said reference member and conducts said images to said image detection member used for offset correction,
   a half-mirror which is installed in a light path between said first reflective body and said image detection member used for offset correction, and
   a second reflective body which reflects images of said tool and said reference member and conducts said images to said half-mirror, and
   wherein said images from said second reflective body are reflected by said half-mirror and conducted to said image detection member used for offset correction.

6. The bonding apparatus according to claim 5, further comprising an image switching means that selectively conducts said images from said first reflective body or said images from said second reflective body to said image detection member used for offset correction.

7. The bonding apparatus according to claim 6, wherein said image switching means comprises:
   a first light source which supplies images of said tool and said reference member to said first reflective body,
   a second light source which supplies images of said tool and said reference member to said second reflective body, and
   a brightness ratio altering means which alters brightness ratio of said first or second light source.

8. The bonding apparatus according to claim 6, wherein said image switching means comprises a screening ratio altering means that alters:
   a screening ratio of a first light path which extends, via said first reflective body, from said tool and said reference member to said half-mirror, and
   a second light path which extends, via said second reflective body, from said tool and said reference member to said half-mirror.

9. A bonding method which uses
   an image detection member used for position detection which detects a position of a bonding object,
   a bonding tool installed so as to be offset with respect to said image detection member used for position detection, and
   a reference member disposed in a specified position,
   wherein said bonding method comprises the steps of:
      measuring a positional relationship between said image detection member used for position detection and said reference member with said image detection member used for position detection, said image detection member used for position detection being in a first attitude in which said image detection member used for position detection is caused to approach said reference member,
      measuring a positional relationship between said tool and said reference member with said image detection member used for offset correction by way of conducting images of said tool and said reference member, said bonding tool being in a second attitude in which said bonding tool is caused to approach said reference member, and images being acquired from a plurality of different directions, and
      determining an accurate amount of offset based upon said measuring results and amounts of movement of said image detection member used for position detection and said tool between said first attitude and second attitude.

* * * * *